United States Patent [19]

Nakaya et al.

[11] Patent Number: 4,870,300
[45] Date of Patent: Sep. 26, 1989

[54] STANDARD CELL SYSTEM LARGE SCALE INTEGRATED CIRCUIT WITH HEAVY LOAD LINES PASSING THROUGH THE CELLS

[75] Inventors: Masao Nakaya; Takeo Nakabayashi; Hideki Andou, all of Hyogo, Japan

[73] Assignee: Mitsubishi Denki Kabushiki Kaisha, Tokyo, Japan

[21] Appl. No.: 51,137

[22] Filed: May 15, 1987

[30] Foreign Application Priority Data

Aug. 6, 1986 [JP] Japan .................... 61-186094

[51] Int. Cl.[4] .................... H01L 27/10
[52] U.S. Cl. .................... 307/303; 307/465; 357/45
[58] Field of Search .................... 307/465, 480, 303; 357/41, 45 M, 68

[56] References Cited

U.S. PATENT DOCUMENTS 4,590,508 5/1986 Hirakawa et al. .................... 357/41

FOREIGN PATENT DOCUMENTS 0135744 8/1984 Japan .................... 357/45
0101950 6/1985 Japan .................... 357/45
2137413 10/1984 United Kingdom .................... 357/45

OTHER PUBLICATIONS

Saigo et al., "A Triple-Level Wired 24K-Gate CMOS Gate Array", *IEEE JSSC*, vol. SC-20, No. 5, Oct. 1985, p. 1005-1010.

Primary Examiner—David Hudspeth
Attorney, Agent, or Firm—Gifford, Groh, Sheridan, Sprinkle, and Dolgorukov

[57] ABSTRACT

This invention relates to a standard cell system large scale integrated circuit which comprises arraying a plurality of standard cells that are equally dimensioned in at least one direction and interconnection said standard cells so as to constitute a logic device, whereby the improvement is characterized in that wiring carrying a heavy load and being connected at many places on the surface of the chip is located within each of the standard cells, furthermore said wiring carrying a heavy load and being connected at many places on the surface of the chip is a clock line, and said clock line is located between a power line and a grounding conductor provided within each standard cell.

5 Claims, 3 Drawing Sheets

STANDARD CELL SYSTEM LARGE SCALE INTEGRATED CIRCUIT WITH HEAVY LOAD LINES PASSING THROUGH THE CELLS

BACKGROUND OF THE INVENTION (1) Field of the Invention

The present invention relates to a standard cell system large scale integrated circuit, and is particularly concerned with a standard cell layout of an integrated circuit using a standard cell as design system.

(2) Description of the Prior Art

FIG. 3 shows a layout of conventional standard cells, wherein 1 denotes a power line, 2 denotes a clock line, 3 denotes a grounding conductor, 4 denotes a standard cell, and 5 denotes a wiring domain.

In such prior art device, only an element connection within the cell 4 is carried out internally, and a connection between the cells 4 is carried out in the wiring domain 5 outside the cells.

Then, the standard cell includes a basic logical element or composite gate such as inverter, NAND, NOR or the like and further D-FF, JK-FF, and for configuring a logical system, the aforementioned standard cells are arrayed and interconnected, however, a width of the wiring used for the interconnection is constant regardless of a species of signals.

The conventional standard cells are configured as described above, and according as an integrated circuit is designed in fine structure the intercell wiring becomes fine. However, in the case of clock line or the like which is abundant in fan-out number and wired on overall surface of a chip, the fine-arranged wiring may give rise to a problem on electron migration and resistance component. That is, if the wiring width is narrowed, a large current flows to the wiring due to charging and discharge where a load is heavy, the electron migration arises consequently, and a capacitance of the wiring decreases, however, since a capacitance of the load is large, the capacitance is not so decreasing as a whole and a resistance of the wiring increases accordingly to a disadvantage. Further, if the wiring width of a specific signal only is enlarged, the wiring becomes complicate generally, thus retarding automation of the wiring.

SUMMARY OF THE INVENTION

The invention has been done to remove the problem mentioned above, and its object is to provide a standard cell system large scale integrated circuit capable of varying a general wiring in width easily from a wiring with heavy load like clock line.

The standard cell system large scale integrated circuit according to the invention is that for which a wiring loaded heavy and covering overall surface of a chip like clock line is laid out within a standard cell.

In the invention, since a wiring with heavy load like clock line is laid out within the standard cell, such wiring can be distinguished from a general wiring and thus these wirings can easily be varied in width.

BRIEF DESCRIPTION OF THE ACCOMPANYING DRAWINGS

DETAILED DESCRIPTION OF THE INVENTION

Figure 1:
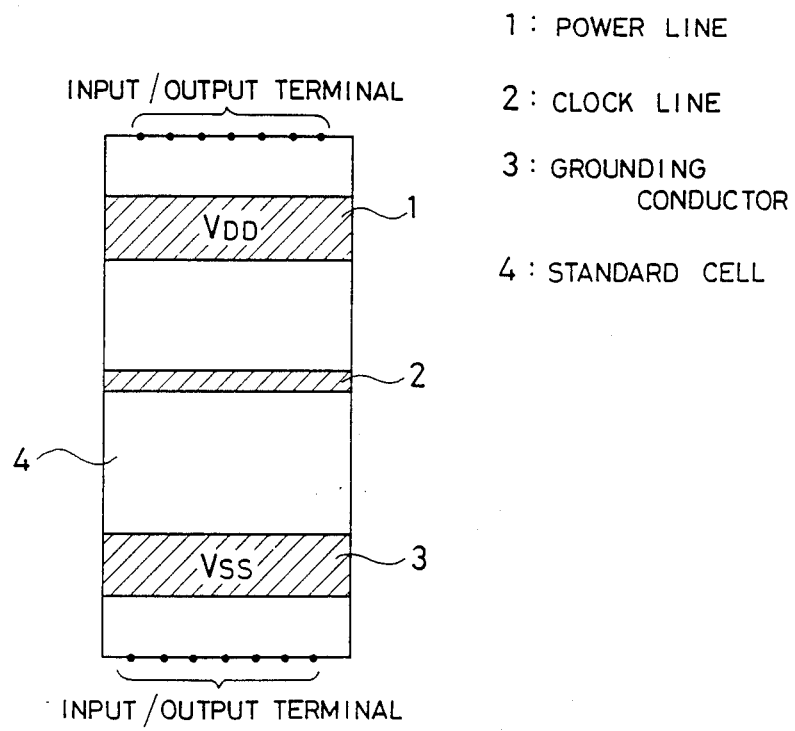
FIG. 1 is a drawing showing a standard cell given in one embodiment of the invention.

One preferred embodiment of the invention will now be described with reference to the accompanying drawings. In the drawing, 1 denotes a power line, 3 denotes a grounding conductor, and 4 denotes a standard cell, which is ready for changing in the the lateral size according to a function coming therein with the vertical size kept constant. A reference numeral 2 denotes a clock line disposed between the power line 1 and the grounding conductor 3 within the standard cell 4. FIG. 2 represents a standard cell system large scale integrated circuit with the standard cell 4 of FIG. 1 arrayed therefor.

Described next is an effect of the function.

In such standard cell system large scale integrated circuit, the clock line 2 is disposed, as shown in FIG. 2, in the standard cell 4, therefore it can be narrowed by the width of a wiring of a wiring band 5 regardless of the clock line 2, and further the clock line is distinguished from a general wiring even in case an automatized program is employed, therefore the clock line can be left in a necessary width while the general wiring only is arranged fine in construction, thus preventing an electron migration and a waveform distortion due to a resistance component of the wiring.

Figure 2:
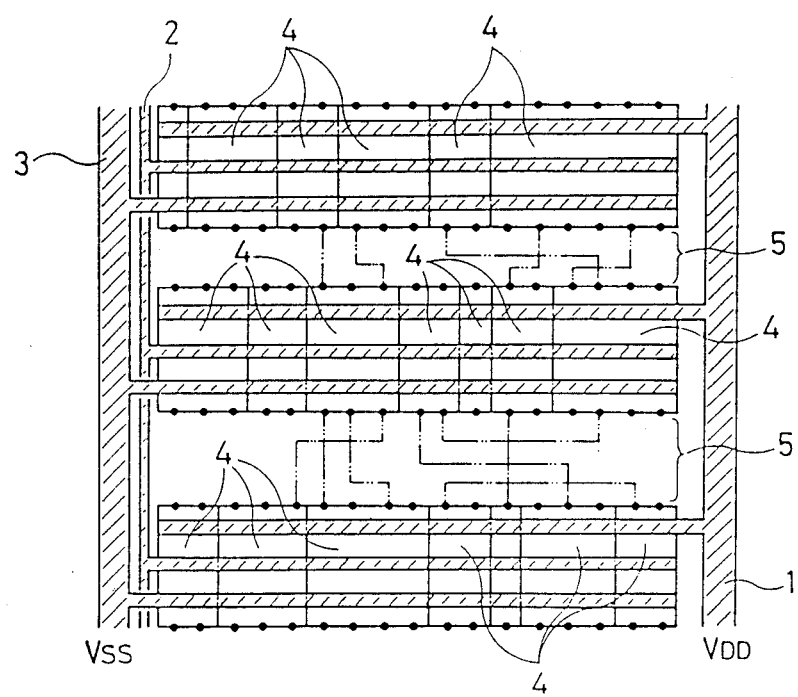
FIG. 2 is a drawing representing a standard cell system large scale integrated circuit with the standard cells arrayed therefor.
Figure 3:
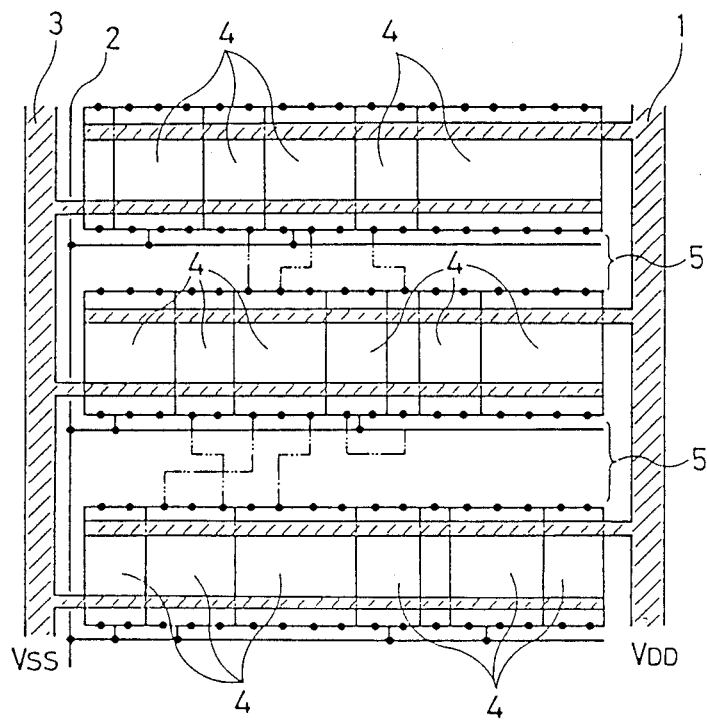
FIG. 3 is a drawing showing a conventional standard cell layout.

Then, as shown in FIG. 1, the clock line 2 is disposed between the grounding conductor 3 and the power line 1, therefore in that for which a p-channel transistor and an n-channel transistor must be spaced out in the standard cell 4 so as to enhance a latching capacity particularly like CMOS, the area can be utilized effectively by passing the clock line 2 through the portion spaced out as above.

In the aforementioned embodiment, the case where the clock line is single has been taken up for description, however, it may come in two pieces or more.

Further in the embodiment, CMOS is indicated as a device constituting the standard cell, however, a bipolar element like ECL or other MOS element will be acceptable.

Then, the invention may be applied not only to the clock line but also to such a wiring as is loaded heavy to have a multiplicity of fan-outs, e.g. a signal line for initializing the circuit as a whole.

As described above, according to the standard cell system large scale integrated circuit of the invention, since the wiring with heavy load like a clock line is laid out within the standard cell, the wiring with heavy load can easily be varied in width from a general wiring, and hence an automatization of the wirings can be facilitated even in case the wiring with heavy load only is enlarged in width while the other general wirings are narrowed in width.

What is claimed is:

1. In a standard cell system large scale integrated circuit which comprises an array of a plurality of standard cells that are equally dimensioned in at least one direction and interconnecting the said standard cells so as to constitute a logic device and having, wiring interconnections extending between the cells, including wiring for carrying out a heavy load as compared to the load carried by other wiring extending between the cells, and connected at many places on the surface of the cells; the improvement is characterized in that the wiring carrying a heavy load and being connected at many places on the surface of the cells is located within each of the standard cells and extends across the standard cells, and said other wiring extending between the cells is carried in wiring areas between the cells.

2. The standard cell system large scale integrated circuit as defined in claim 1, wherein said wiring carrying a heavy load and being connected at many places on the surface of the cells is a clock line.

3. The Standard Cell System Large Scale Integrated Circuit as defined in claim 2, wherein said wiring carrying a heavy load is disposed between a power line and a grounding conductor provided within each standard cell.

4. In a standard cell system large scale integrated circuit which comprises an array of a plurality of standard cells that are equally dimensioned in at least one direction and interconnected so as to constitute a logic device, the grounding conductor, and any lines carrying a heavier current than the general wiring within the cell, being placed between the components contained in the standard cell.

5. The device defined in claim 4, wherein said lines are placed proximate the middle of the cell.

* * * * *